(12) United States Patent
Hamner et al.

(10) Patent No.: US 8,282,422 B2
(45) Date of Patent: Oct. 9, 2012

(54) ELECTRICAL CONNECTOR ASSEMBLY HAVING A SEPARABLE MATING INTERFACE

(75) Inventors: Richard Elof Hamner, Hummelstown, PA (US); Scott Stephen Duesterhoeft, Etters, PA (US); Robert Neil Mulfinger, York Haven, PA (US); Jason M'Cheyne Reisinger, Carlisle, PA (US); Attalee Snarr Taylor, Palmyra, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 305 days.

(21) Appl. No.: 12/625,315

(22) Filed: Nov. 24, 2009

(65) Prior Publication Data

US 2011/0124231 A1    May 26, 2011

(51) Int. Cl.
*H01R 24/00* (2011.01)
(52) U.S. Cl. .................................. 439/631; 439/342
(58) Field of Classification Search .................. 439/631, 439/342
See application file for complete search history.

(56) References Cited

U.S. PATENT DOCUMENTS

| | | | |
|---|---|---|---|
| 3,215,973 A * | 11/1965 | Falconer ..................... | 439/711 |
| 4,085,990 A | 4/1978 | Jayne | |
| 4,518,210 A | 5/1985 | Morrison | |
| 4,603,928 A | 8/1986 | Evans | |
| 4,626,056 A | 12/1986 | Andrews, Jr. et al. | |
| 4,629,270 A | 12/1986 | Andrews, Jr. et al. | |
| 4,731,698 A | 3/1988 | Millot et al. | |
| 4,836,798 A * | 6/1989 | Carter ........................ | 439/268 |
| 4,840,569 A | 6/1989 | Cabourne | |
| 4,842,538 A * | 6/1989 | Noschese ..................... | 439/260 |
| 5,092,781 A * | 3/1992 | Casciotti et al. ............... | 439/62 |
| 5,102,342 A | 4/1992 | Marian | |
| 5,171,154 A | 12/1992 | Casciotti et al. | |
| 5,228,863 A | 7/1993 | Campbell et al. | |
| 5,290,192 A * | 3/1994 | Espenshade et al. ......... | 439/266 |
| 6,062,872 A | 5/2000 | Strange et al. | |
| 6,077,090 A | 6/2000 | Campbell et al. | |
| 6,191,592 B1 * | 2/2001 | Ohsawa et al. ............... | 324/538 |
| 6,411,517 B1 | 6/2002 | Babin | |
| 6,431,899 B1 * | 8/2002 | Keller ........................ | 439/342 |
| 6,672,878 B2 | 1/2004 | Dean | |
| 6,685,489 B1 * | 2/2004 | Rubenstein et al. .......... | 439/157 |
| 6,890,201 B2 * | 5/2005 | Hashiguchi et al. .......... | 439/259 |
| 7,226,305 B1 | 6/2007 | Costello et al. | |
| 7,297,015 B1 | 11/2007 | Desrosiers et al. | |
| 7,374,441 B2 | 5/2008 | Rubenstein | |
| 7,419,400 B1 | 9/2008 | Taylor et al. | |
| 7,425,134 B1 | 9/2008 | Taylor | |
| 7,438,582 B2 | 10/2008 | Taylor | |
| 7,997,918 B2 * | 8/2011 | Canfield et al. ............... | 439/310 |
| 2007/0097662 A1 | 5/2007 | Dean | |
| 2008/0227314 A1 | 9/2008 | Taylor | |

OTHER PUBLICATIONS

Neoconix PCBeam™ Interposer Design Guide, Neoconix, Rev. 070925, 4 pgs.

* cited by examiner

*Primary Examiner* — Briggitte R Hammond

(57) ABSTRACT

An electrical connector assembly includes a connector having a connector housing and contacts held by the connector housing, where the contacts defining a separable mating interface for mating with a mating component. An actuator engages the contacts and is movable between an actuated position and an unactuated position. The contacts are deflected relative to the connector housing when the actuator is moved to the actuated position. An actuation device is configured to move the actuator between the actuated position and the unactuated position.

20 Claims, 6 Drawing Sheets

ELECTRICAL CONNECTOR ASSEMBLY HAVING A SEPARABLE MATING INTERFACE

BACKGROUND OF THE INVENTION

The subject matter herein relates generally to electrical connectors, and more particularly, to electrical connectors having separable mating interfaces.

Electrical connectors are typically used for making an electrical connection between circuit boards. Some electrical systems, such as servers, routers, and data storage systems, utilize board-to-board electrical connectors for transmitting signals through the electrical system. One particular application is in a backplane application in which a daughter card, in the form of a circuit board, is electrically connected to a backplane by an electrical connector. The daughter card is loaded into a slot such that the daughter card is arranged perpendicular to the backplane. The daughter card slides along a mating interface of the electrical connector until the daughter card reaches a final engaged position with respect to the electrical connector and the backplane.

However, problems may arise in such backplane applications. For example, as the daughter card is slid into position across the mating interface with the electrical connector, the insertion force of the daughter card may be high. It is sometimes difficult to load the daughter card in place. Improper loading may occur due to the high insertion force. Additionally the contacts of the electrical connector may be damaged as the daughter card is slid into position across the contacts. With high density applications, many contacts are provided, and the problems described above may be exaggerated. A need remains for an electrical connector that provides a zero insertion force for the daughter card. A need remains for orthogonal interconnects that eliminate a midplane.

BRIEF DESCRIPTION OF THE INVENTION

In one embodiment, an electrical connector assembly is provided that includes a connector having a connector housing and contacts held by the connector housing, where the contacts define a separable mating interface for mating with a mating component. An actuator engages the contacts and is movable between an actuated position and an unactuated position. The contacts are deflected relative to the connector housing when the actuator is moved to the actuated position. An actuation device is configured to move the actuator between the actuated position and the unactuated position.

In a further embodiment, an electrical connector assembly for electrically connecting a first circuit board to a second circuit board is provided. The electrical connector assembly includes a connector having a connector housing having a front oriented parallel to and spaced apart from the second circuit board. The connector also has contacts held by the connector housing, where each contact is terminated to the first circuit board and each contact is configured to engage the second circuit board at the mating interface to make electrical contact with the second circuit board. An actuator engages the contacts proximate to the mating interfaces. The actuator is movable between an actuated position and an unactuated position, and the actuator moves the mating interfaces of the contacts between open and closed positions as the actuator is moved between the actuated and unactuated positions, respectively. The mating interfaces are configured to engage the second circuit board in the closed position and the mating interfaces are positioned away from the second circuit board in the open position. An actuation device is configured to move the actuator between the actuated position and the unactuated position.

In a further embodiment, an electrical connector assembly is provided that includes a connector having a connector housing and contacts held by the connector housing. The contacts define a separable mating interface for mating with a mating component, and the contacts being arranged in columns. An actuator is movably coupled to the connector housing. The actuator has a frame having a plurality of crosspieces. Each of the crosspieces engages a corresponding one of the columns of contacts. The actuator is movable between an actuated position and an unactuated position, and the contacts are deflected by the crosspieces relative to the connector housing when the actuator is moved to the actuated position. An actuation device is configured to move the actuator between the actuated position and the unactuated position.

DETAILED DESCRIPTION OF THE INVENTION

Figure 1:
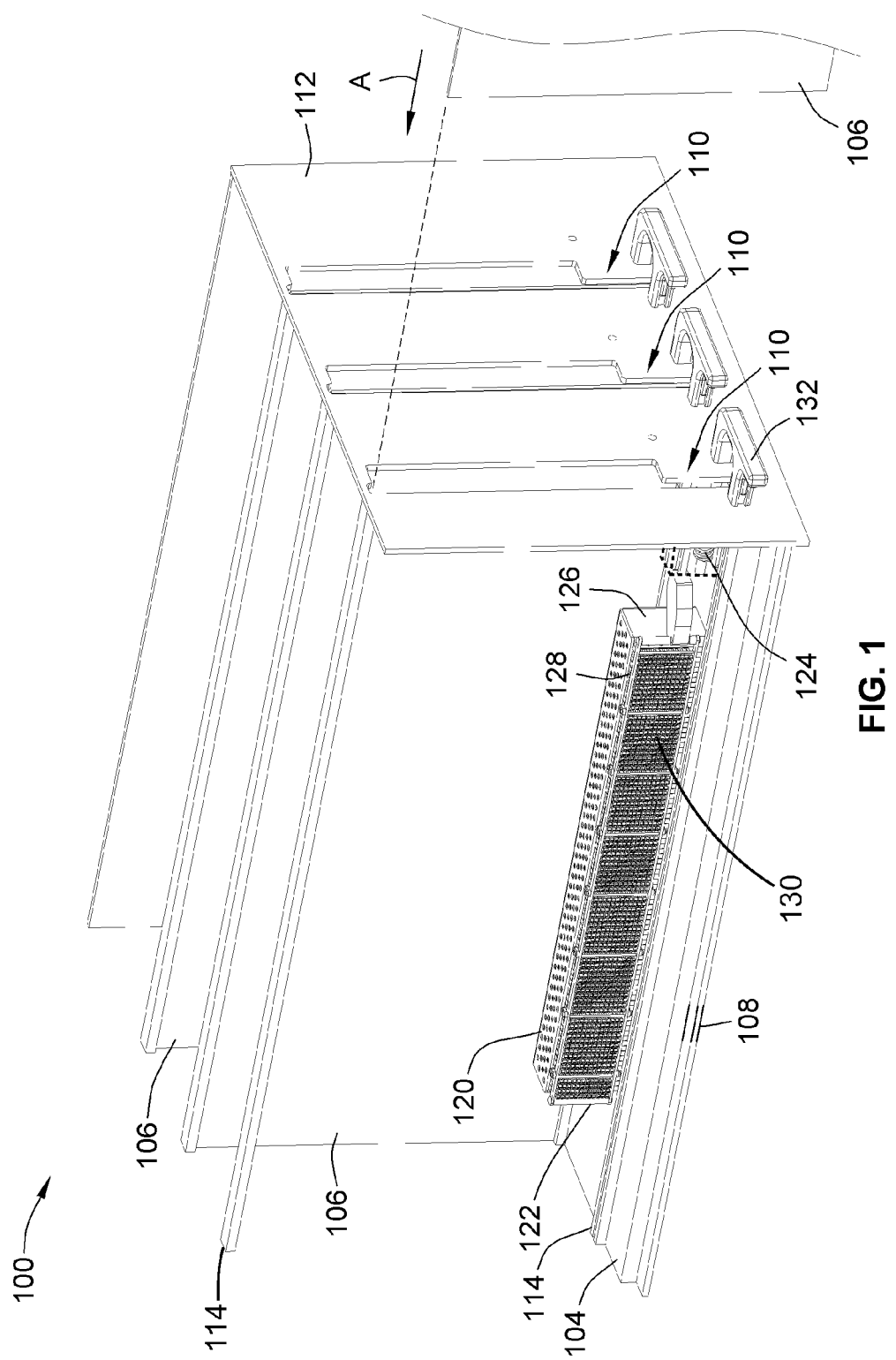
FIG. 1 illustrates an electrical system that utilizes an electrical connector assembly formed in accordance with an exemplary embodiment.

FIG. 1 illustrates an electrical system 100 that utilizes an electrical connector assembly 102 formed in accordance with an exemplary embodiment. The electrical system 100 includes a first circuit board 104 and one or more second circuit boards 106 configured to be electrically connected to the first circuit board 104 by one or more of the electrical connector assemblies 102.

In the illustrated embodiment, the first circuit board 104 constitutes a backplane and the second circuit board 106 constitutes a daughter card. The first circuit board 104 may be held within a chassis 108 or other system component. A portion of the chassis 108 has been removed for clarity. The second circuit board 106 is coupled to the first circuit board 104 during a mating operation. For example, the second circuit board 106 may be loaded through a slot 110 in a panel 112 associated with the chassis 108 in a loading direction, represented by an arrow A. The second circuit board 106 may be unloaded in an opposite direction. Optionally, a card guide 114 may be coupled to the first circuit board 104 to guide the second circuit board 106 into position with respect to the first circuit board 104. In the illustrated embodiment, the second circuit board 106 is oriented in a perpendicular orientation with respect to the first circuit board 104. FIG. 1 illustrates two circuit boards 106 in loaded positions with respect to the first circuit board 104 and one circuit board 106 in an unloaded position.

The backplane/daughter card configuration illustrated in FIG. 1 is merely illustrative of an application that may utilize the electrical connector assemblies 102, and the use of the electrical connector assemblies 102 is not limited to such an application. The electrical connector assemblies 102 may be utilized in other board-to-board applications, such as for mating circuit boards that are oriented parallel to one another.

Each electrical connector assembly 102 includes a connector 120, an actuator 122 movable with respect to the connector 120, and an actuation device 124 operatively coupled to the actuator 122. The connector 120 includes a connector housing 126 that holds a plurality of contact modules 128. Each of the contact modules 128 includes a plurality of contacts 130 arranged in a column. The contacts 130 are terminated to the first circuit board 104. Optionally, the contacts 130 may be terminated to the first circuit board 104 by a separable interface. The contacts 130 define a separable mating interface that is configured to be mated with the second circuit board 106.

The actuator 122 is movable between an actuated position and an unactuated position. The actuator 122 engages the contacts 130 to move the contacts 130 relative to the second circuit board 106. For example, as will be described in further detailed below, the contacts 130 may be moved from a closed position, in which the contacts 130 engage the second circuit board 106, to an open position, in which the contacts 130 do not engage the second circuit board 106.

The closed and open positions correspond to the unactuated and actuated positions, respectively, of the actuator 122. Additionally, the closed and open positions of the contacts 130, and the corresponding unactuated and actuated positions of the actuator 122, represent closed and open states of the electrical connector assembly 102. For example, when the contacts 130 are engaged with corresponding contacts of the second circuit board 106, an electrical circuit is closed. When the contacts 130 are unengaged, no electrical circuit is complete, and the electrical circuit is open. Furthermore, when the actuator 122 is unactuated, the contacts 130 are allowed to close so that the contacts 130 may be mated with the second circuit board 106. However, when the actuator 122 is actuated, the contacts 130 are pushed away from the second circuit board 106, leaving a space or opening for the second circuit board 106. As such, the second circuit board 106 may be loaded or unloaded with zero insertion forces or removal forces imparted by the contacts 130.

The actuation device 124 is operated to move the actuator 122 between the actuated position and the unactuated position. In the illustrated embodiment, the actuation device 124 includes a handle 132 that may be rotated to move the actuator 122. The handle 132 is rotated from a closed position to an open position. The closed and open positions correspond to the closed and open states, respectively, of the electrical connector assembly 102. In the closed position, the handle 132 blocks the slot 110 in panel 112. As such, the second circuit board 106 cannot be removed from, or inserted into, the slot 110. Different types of actuation devices may be provided to actuate the actuator 122 in different ways.

Figure 2:
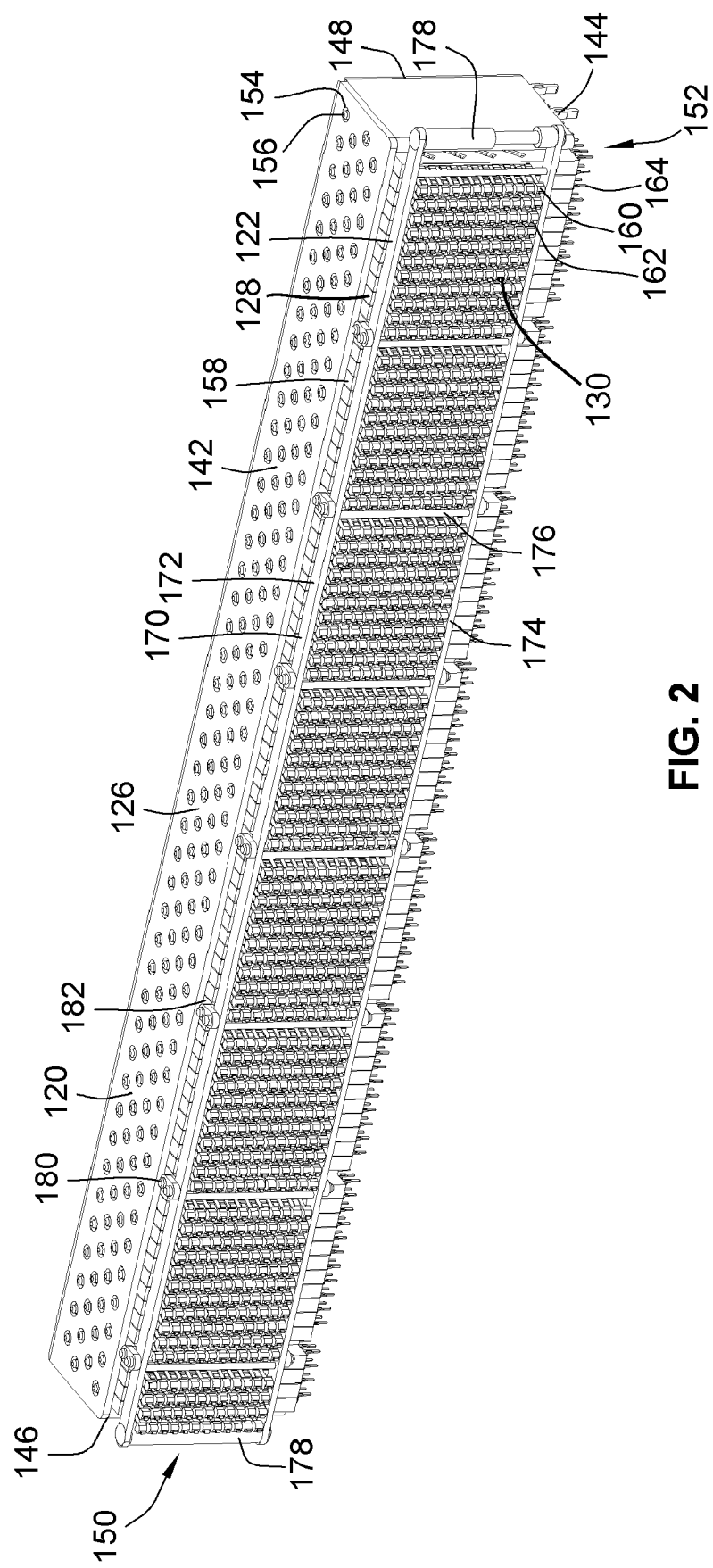
FIG. 2 is a front perspective view of a portion of the electrical connector assembly shown in FIG. 1.

FIG. 2 is a front perspective view of the connector 120 and the actuator 122. The connector 120 includes a connector housing 126 that holds the contact modules 128. The connector housing 126 has a top 142, a bottom 144, a front 146, and a rear 148.

In an exemplary embodiment, the connector 120 defines a right angle connector having a mating face 150 and a mounting face 152 that are perpendicular to one another. The mating face 150 is configured to face the second circuit board 106 (shown in FIG. 1). The connector 120 is mated with the second circuit board 106 at the mating face 150. The mounting face 152 is configured to face the first circuit board 104. The connector 120 is mounted to the first circuit board 104 at the mounting face 152. The mating face 150 is defined along the front 146. The mounting face 152 is defined along the bottom 144. Optionally, the contact modules 128 may extend partially beyond the front 146 and/or the bottom 144. The contact modules 128 may extend beyond the rear 148 and/or the top 142 in alternative embodiments.

The top 142 includes a plurality of openings 154 that receive pins 156 of the individual contact modules 128. The pins 156 locate the contact modules 128 within the connector housing 126. The pins 156 may be used as polarizing features that control where the contact modules 128 are located within the connector housing 126. For example, in the illustrated embodiment, two different types of contact modules 128 are arranged within the connector housing 126 in an alternating sequence. The different types of contact modules 128 have pins 156 located in different positions.

The contact modules 128 are loaded in the connector housing 126 such that the contact modules 128 are parallel to one another. Any number of contact modules 128 may be provided depending on the particular application and the contact density desired. Each of the contact modules 128 holds a plurality of the contacts 130. The contact modules 128 have a dielectric body 158 that holds the contacts 130 in a particular configuration. In an exemplary embodiment, the contact modules 128 are of the overmolded lead frame type, with the lead frame defining the contacts 130 and with the plastic overmolded material defining the dielectric body 158. Other types of contact modules may be used in alternative embodiments. For example, the dielectric body 158 may be formed from two pieces that are coupled together and that sandwich the contacts 130 therebetween. Other alternatives include a circuit board having contacts extending therefrom, or flex circuits that are held by the connector housing 126 or that are held by a substrate or rigid backer loaded into the connector housing 126.

The contacts 130 have mating portions 160 that are exposed and that extend forward from the dielectric body 158. The mating portions 160 are configured to be mated with corresponding contacts (e.g. contact pads) of the second circuit board 106. The mating portions 160 define the separable mating interface of the connector 120. The mating portions 160 are cantilevered from the dielectric body 158 and extend to a distal end 162.

The contacts 130 have mounting portions 164 that are exposed and that extend downward from the dielectric body 158. The mounting portions 164 are configured to be terminated to the first circuit board 104. In the illustrated embodiment, the mounting portions 164 constitute eye of the needle contacts that may be through-hole mounted into vias of the first circuit board 104. Alternatively, the mounting portions 164 may be configured for surface mounting to the first circuit board 104, such as using solder or by a separable interface.

The actuator 122 is movably coupled to the connector housing 126. The actuator 122 is coupled to the front 146 of the connector housing 126. The actuator 122 may be oriented generally parallel to the front 146. As the actuator 122 is moved, the actuator 122 may remain parallel to the front 146. The actuator 122 is interspersed between the columns of contacts 130. As such, the actuator 122 is configured to engage each of the contacts 130 such that each of the contacts 130 may be simultaneously moved by the actuator 122.

The actuator 122 includes a frame 170 having top and bottom frame members 172, 174, respectively. The frame 170 also includes crosspieces 176 that extend perpendicular to the frame members 172, 174. The crosspieces 176 extend between the frame members 172, 174. Optionally, the crosspieces 176 may be cylindrical, however the crosspieces 176 are not limited to a cylindrical shape. The crosspieces 176 are configured to engage corresponding columns of the contacts 130. As the actuator 122 is moved between the actuated and unactuated positions, the crosspieces 176 move the contacts 130. In an exemplary embodiment, the frame members 172, 174 and the crosspieces 176 together define a structure that is similar to a ladder, with the crosspieces representing the rungs of the ladder. The frame 170 includes end pieces 178 at both ends of the frame members 172, 174. The crosspieces 176 and/or the end pieces 178 support the frame members 172, 174 and hold the frame members 172, 174 at a predetermined distance from one another. The frame members 172, 174 extend parallel to one another.

In an exemplary embodiment, the frame 170 is coupled to the connector housing 126 by hinges 180. The hinges 180 are coupled to the frame members 172, 174. The hinges 180 are also coupled to pivot blocks 182 of the connector housing 126. The pivot blocks 182 may be positioned anywhere along the connector housing 126. Alternatively, the hinges 180 may be directly coupled to the top 142 and/or the bottom 144 of the connector housing 126. Other types of coupling means may be provided in alternative embodiments to couple the actuator 122 to the connector housing 126. The coupling means may allow a pivoting motion of the actuator 122 or may allow other types of movement, such as linear sliding movement. For example, the connector housing 126 may have longitudinal slots formed therein that receive links or other elements of the actuator 122 to allow linear movement of the actuator 122 with respect to the connector housing 126. In other alternative embodiments, the frame 170 may be coupled to another structure other than the connector housing 126, such as the chassis 108 or first circuit board 104 (shown in FIG. 1).

Figure 3:
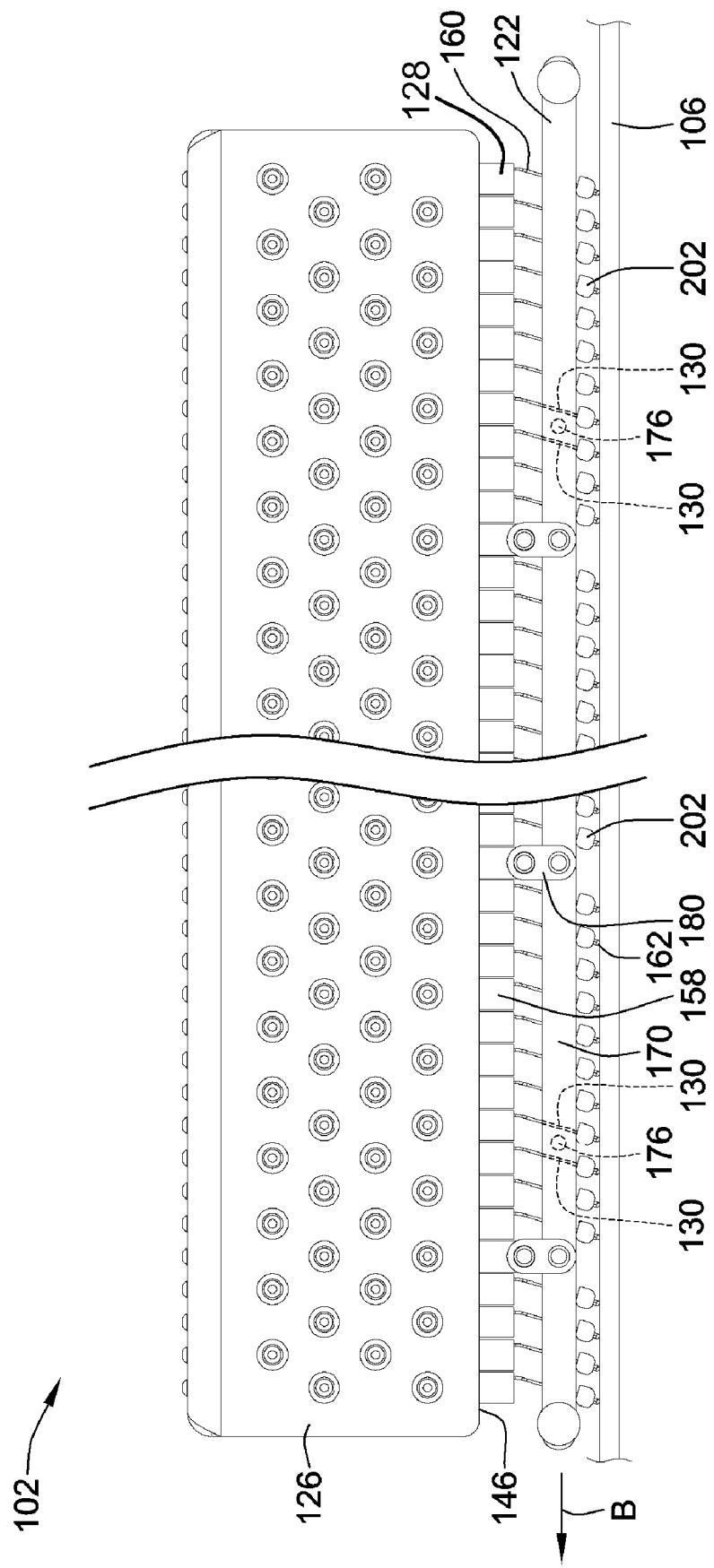
FIG. 3 is a top view of a portion of the electrical connector assembly in a closed state.
Figure 4:
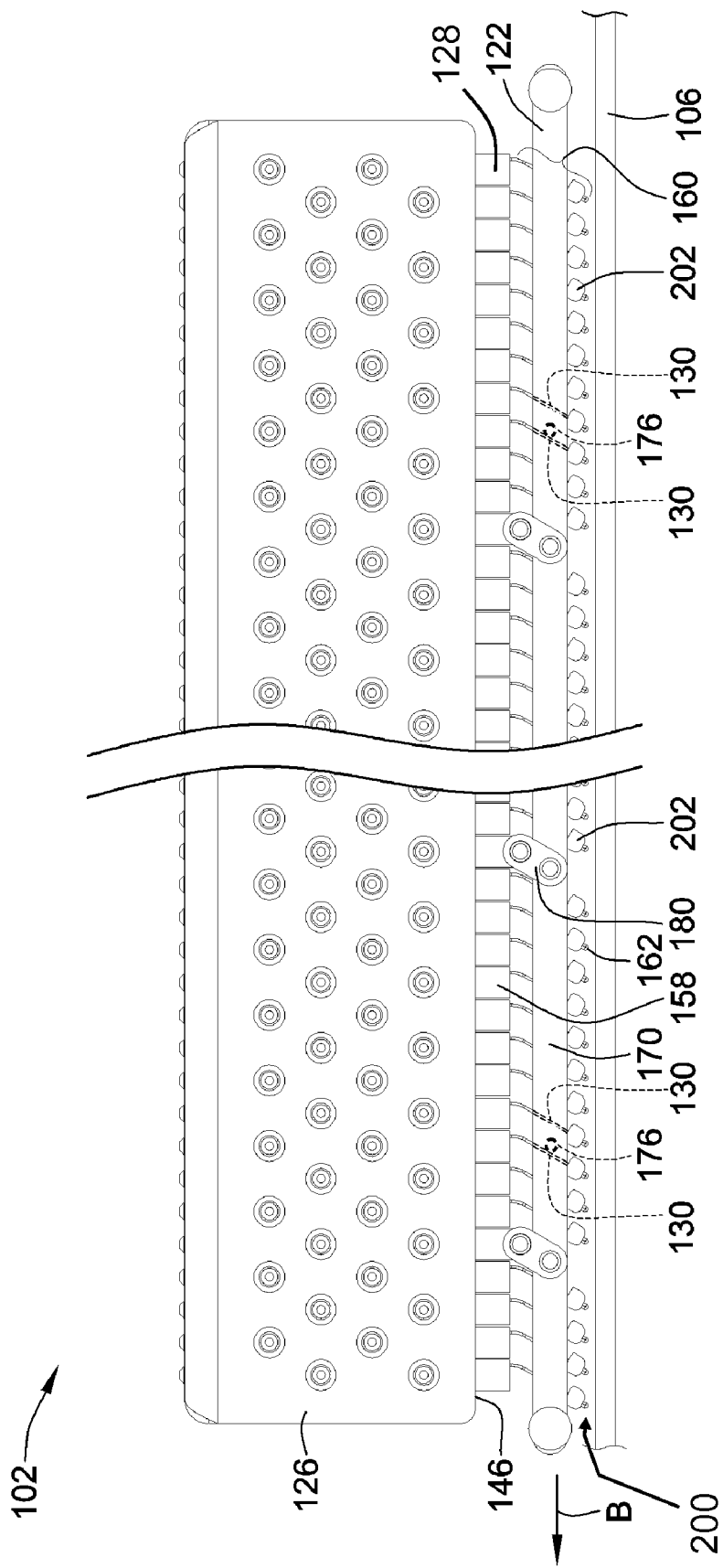
FIG. 4 top view a portion of the electrical connector assembly in an open state.

FIG. 3 is a top view of a portion of the electrical connector assembly 102 in a closed state. In the closed state, the contacts 130 engage the second circuit board 106. In the closed state, the actuator 122 is in the unactuated position. FIG. 4 is a top view a portion of the electrical connector assembly 102 in an open state. In the open state, the contacts 130 are disengaged from the second circuit board 106. The tips of the contacts 130 are held away from circuit board 106 to create a space 200 between the contacts 130 and the second circuit board 106. In the open state, the actuator 122 is in the actuated position.

The actuator 122 is moved from the unactuated position to the actuated position to deflect each of the contacts 130. For example, the actuator 122 is generally pushed in an actuation direction, shown by the arrow B, which simultaneously forces the contacts 130 to move in the similar direction. The actuator 122 may be either translated or rotated in the actuation direction. The hinges 180 control the range of motion of the frame 170. Optionally, the actuator 122 may remain parallel to the front 146 of the connector housing 126 throughout the entire range of motion of the actuator 122.

The contacts 130 are shifted in the actuation direction as the actuator 122 is moved to the actuated position. The crosspieces 176 are shown in phantom in FIGS. 3 and 4 to indicate their positions with respect to the contacts 130. As the contacts 130 are moved to the open position, the contacts 130 are bent proximate to the dielectric body 158 of the corresponding contact module 128. Such bending causes the distal ends 162 of the contacts 130 to move relatively closer to the connector housing 126, while at the same time moving relatively further away from the second circuit board 106 to create the space 200. The contacts 130 may be pivoted generally about the dielectric body 158 or may be bowed along the length of the mating portion 160. The deflection of the contacts 130 creates normal force on the actuator 122 in a direction opposite to the actuation direction. The normal force may be sufficient to return the actuator 122 to the unactuated position when force is no longer applied to the actuator 122 in the actuation direction.

The actuator 122 is held in the actuated position to accommodate loading and unloading of the second circuit board 106. In the actuated position, the contacts 130 are held open such that the contacts 130 do not interfere with movement of the second circuit board 106 during loading or unloading of the second circuit board 106. As such, the insertion force required to load the second circuit board 106 into position may be minimal. Optionally, the insertion force may be a zero insertion force as the contacts 130 do not engage the second circuit board 106 at all until the contacts 130 are moved to the closed position. Additionally, because the distal ends 162 of the contacts 130 do not engage the second circuit board 106 as the second circuit board 106 is loaded and unloaded, wear on the contacts 130 and/or the second circuit board 106 may be minimal or entirely mitigated.

Once the second circuit board 106 is properly positioned with respect to the electrical connector assembly 102, the actuator 122 may be released to return to the unactuated position. Optionally, the contacts 130 may force the frame 170 to move to the unactuated position. Alternatively, the actuator 122 may be forced to the unactuated position by the actuation device 124 (shown on FIG. 1). For example, movement of the handle 132 (shown in FIG. 1) to the closed position may force the actuator 122 to the unactuated position. Optionally, the actuator 122 may engage the contacts 130 as the actuator 122 is moved to the unactuated position to force the contacts 130 to move in the same direction to the closed position. For example, the crosspieces 176 may engage one column of contacts 130 when moving to the actuated position and the crosspieces 176 may engage a different column of contacts 130 when moving to the unactuated position. In other words, the crosspieces 176 may push the contacts 130 in one direction and may pull different columns of the contacts 130 in the opposite direction. The crosspieces 176 may pull the contacts 130 against the second circuit board 106 to allow the distal ends 162 to wipe against the contact pads on the second circuit board 106. Alternatively, the contacts 130 may automatically wipe against the contact pads as the contacts 130 spring back to the closed position.

In an exemplary embodiment, the mating portions 160 of the contacts 130 have a retainer 202 coupled thereto. The retainer 202 is positioned forward of the frame 170. The crosspieces 176 may engage the retainer 202 to push the contacts 130 to the open position. The retainer 202 may stop the distal ends 162 from slipping past the crosspieces 176. In an exemplary embodiment, the retainer 202 is over molded over the mating portion 160 proximate to the distal ends 162. Optionally, the mating portion 160 may be folded over at the distal end 162 to double the thickness of the mating portion 160 at the distal end 162. Part of the folded over section of the mating portion 160 may be over molded with the retainer 202. The retainer 202 may be secured to the contacts 130 in other ways other than by over molding. Optionally, the contact 130 may be bent in a particular manner to form the retainer 202.

Figure 5:
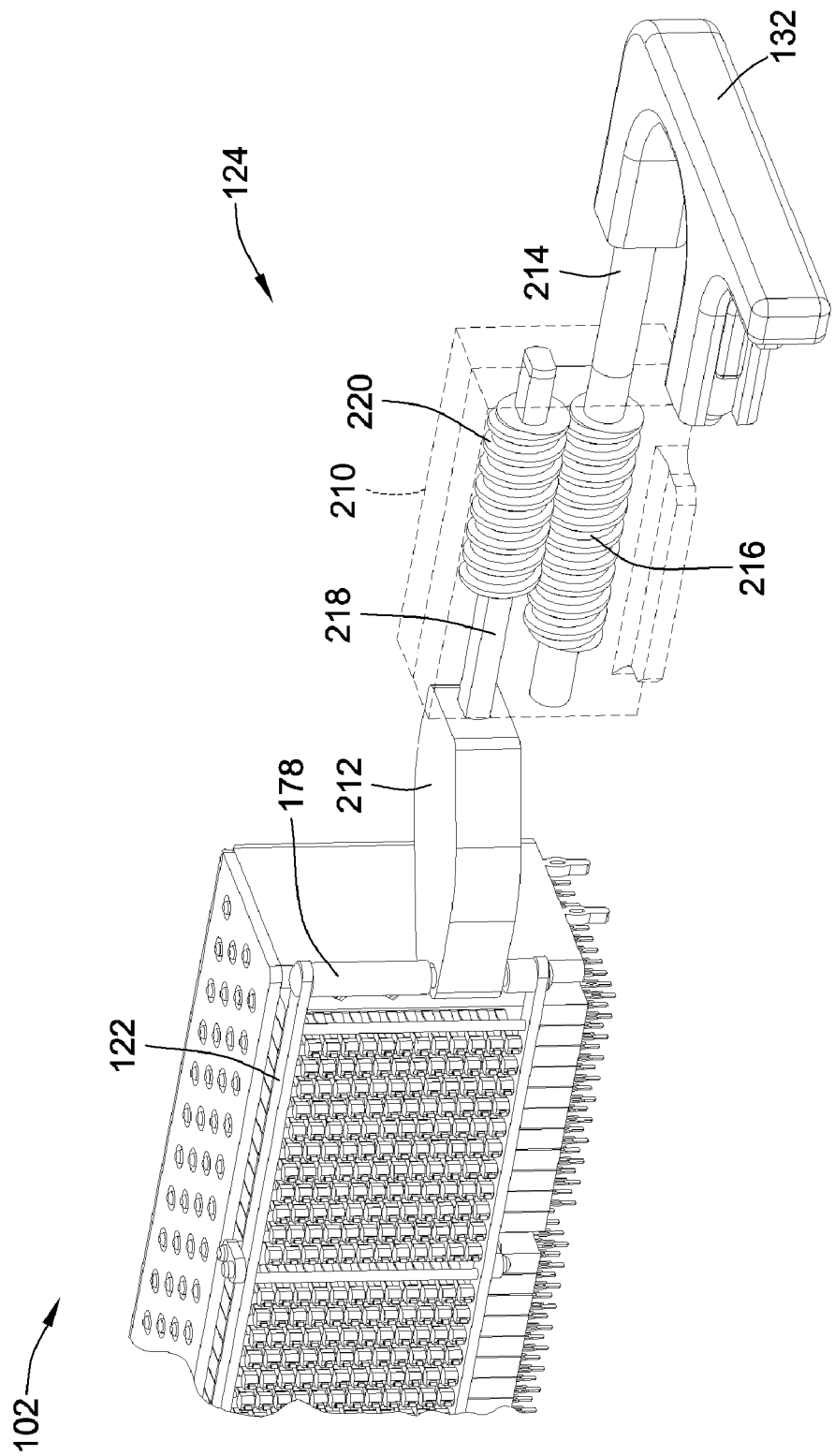
FIG. 5 is a front perspective view of an actuation device for the electrical connector assembly, illustrating the actuation device in an unactuated position corresponding to the closed state of the electrical connector assembly.
Figure 6:
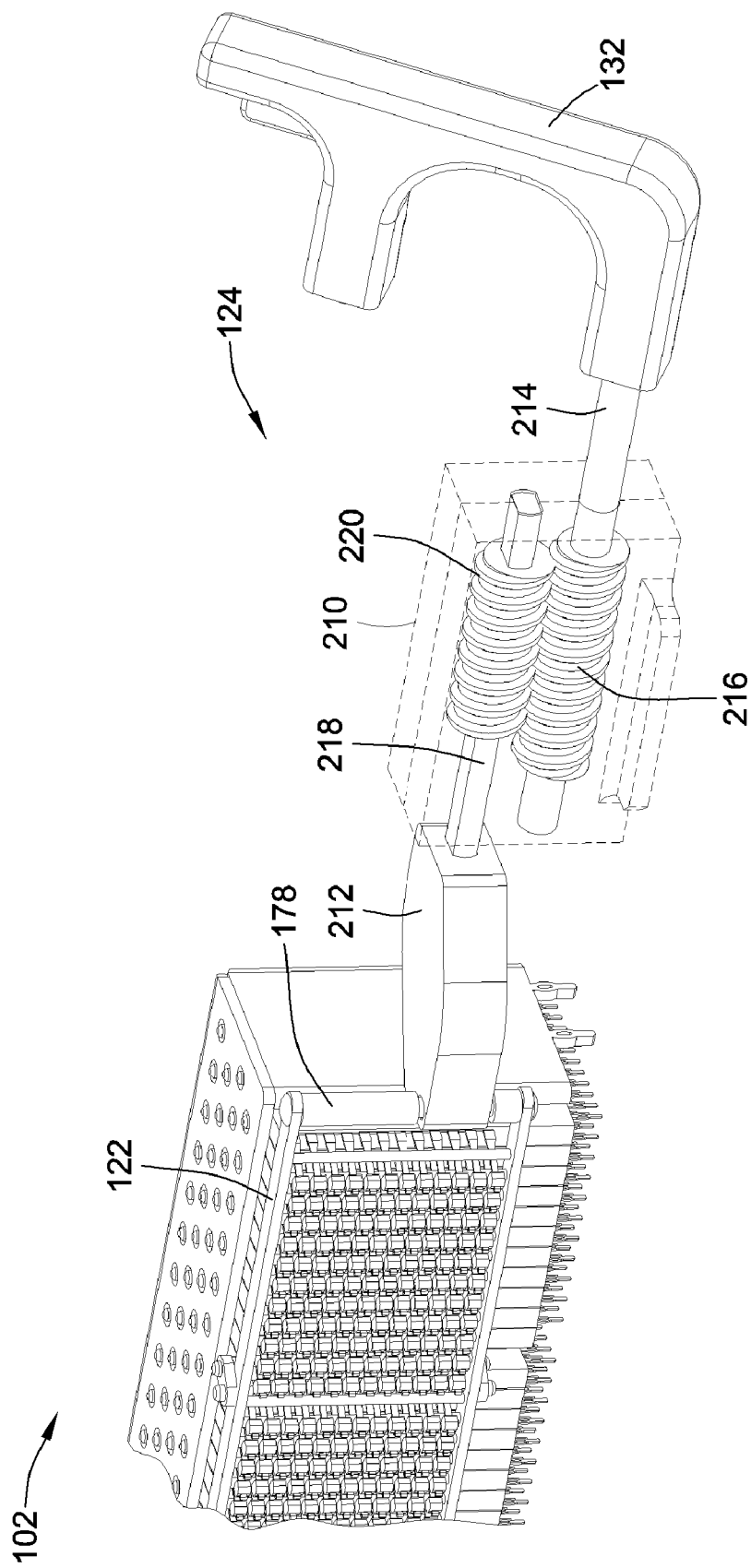
FIG. 6 is a front perspective view of the actuation device shown in FIG. 5 in an actuated position corresponding to the open state of the electrical connector assembly.

FIG. 5 is a front perspective view of the actuation device 124 for the electrical connector assembly 102, illustrating the actuation device 124 in an unactuated position corresponding to the closed state of the electrical connector assembly 102. FIG. 6 is a front perspective view of the actuation device 124 in an actuated position corresponding to the open state of the electrical connector assembly 102.

The actuation device 124 includes the handle 132, a gearbox 210 and a coupler 212 that is coupled to the actuator 122. Optionally, the coupler 212 may be coupled to the end piece 178. In an alternative embodiment, the coupler 212 may be coupled to one or both of the frame members 172, 174. The handle 132 may be operated by the user to transition the electrical connector assembly 102 between the closed state and the open state. In the illustrated embodiment, the handle 132 is rotatable from the unactuated position to the actuated position.

The gearbox 210 transfers the rotational movement of the handle 132 into linear movement of the coupler 212. A first shaft 214 has a first gear 216 coupled thereto. The first shaft 214 is coupled to the handle 132. A second shaft 218 has a second gear 220 coupled thereto. The second shaft 218 is coupled to the coupler 212. As the second gear 220 rotates, the second shaft 218 moves linearly toward or away from the connector housing 126, depending on the direction of rotation.

Alternative actuation means are possible in alternative embodiments. For example, a cam may be used to transfer motion to the actuator 122. The actuation device 124 may accommodate linear movement of the handle 132 rather than rotational movement of the handle 132. Such linear movement may be transferred directly to the actuator 122. The handle 132 may have a push/pull configuration to transfer the actuator 122 from the unactuated position to the actuated position (e.g. push) and from the actuated position to the unactuated position (e.g. pull). Alternatively, the handle 132 may have a push/push configuration to transfer the actuator 122. For example, the handle 132 may be pushed inward a first time to lock the actuator 122 in the actuated position. The handle 132 may then be pushed inward a second time to unlock the actuator 122 and allow the actuator 122 to move to the unactuated position. A spring-loaded device or other means may be provided to allow such actuation movement. Some alternative embodiments may utilize an electronic device such as a server motor or solenoid to move the actuator 122.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. An electrical connector assembly comprising:
    a connector having a connector housing and contacts held by the connector housing, the housing having a front, the contacts extending out of the housing forward from the front to define a separable mating interface exterior of the housing for mating with a mating component;
    an actuator engaging the contacts, the actuator being movable between an actuated position and an unactuated position, the contacts being deflected relative to the connector housing when the actuator is moved to the actuated position, the actuator being movably coupled to the connector housing such that the actuator generally slides along the front between the actuated position and the unactuated position; and
    an actuation device configured to move the actuator between the actuated position and the unactuated position.

2. The assembly of claim 1, wherein the contacts extend outward from the connector housing to engage the mating component, the contacts being disengaged from the mating component when deflected by the actuator.

3. The assembly of claim 1, wherein the contacts are arranged in columns, the actuator including a frame having crosspieces, each crosspiece engaging the contacts of a corresponding one of the columns.

4. The assembly of claim 1, wherein each contact is cantilevered from the connector housing and extends to a distal end, the separable mating interface being defined at the distal ends of the contacts, the distal ends being positioned a first distance from the connector housing when the actuator is in the unactuated position, the distal ends being moved relatively closer to the connector housing and being positioned a second distance from the connector housing when the actuator is in the actuated position, the second distance being less than the first distance.

5. The assembly of claim 1, further comprising a plurality of contact modules holding corresponding ones of the contacts in a column, the contact modules being held within the connector housing parallel to one another.

6. The assembly of claim 1, the contacts being configured to engage contact pads of a ciricuit board defining the mating component when the actuator is in the unactuated position, the contacts being configured to be held away from the contact pads by the actuator when the actuator is in the actuated position.

7. The assembly of claim 1, wherein the actuator includes a frame having a pair of parallel frame members and crosspieces that extend between the frame members, each crosspiece engaging a plurality of the contacts, the frame being moved by the actuation device from the unactuated position to the actuated position such that the crosspieces simultaneously push the contacts relatively closer to the connector housing.

8. The assembly of claim 1, wherein the contacts are configured to be moved out of the path of the mating component to allow the mating component to be moved in a loading direction without interference with the contacts, the contacts being configured to be moved into engagement with the mating component after the mating component is positioned in a loaded position.

9. An electrical connector assembly for electrically connecting a first circuit board to a second circuit board, the electrical connector assembly comprising:
    a connector having a connector housing having a front oriented parallel to and spaced apart from the second circuit board, the connector having contacts held by the connector housing and extending from the front to a mating interface, each contact being terminated to the first circuit board, each contact being configured to engage the second circuit board at the mating interface to make electrical contact with the second circuit board;

an actuator engaging the contacts proximate to the mating interface, the actuator being movable between an actuated position and an unactuated position, the actuator moving the mating interface of each of the contacts between open and closed positions as the actuator is moved between the actuated and unactuated positions, respectively, wherein the mating interface is configured to engage the second circuit board in the closed position and wherein the mating interface is positioned away from the second circuit board in the open position; and an actuation device configured to move the actuator between the actuated position and the unactuated position.

10. The assembly of claim 9, wherein the contacts are arranged in columns, the actuator including a frame movably coupled to the connector housing, the frame having crosspieces that each engage the contacts of a corresponding one of the columns.

11. The assembly of claim 9, wherein the actuator generally slides along the front between the actuated position and the unactuated position, the contacts being moved to the closed position as the actuator moves to the unactuated position, the contacts wiping across the second circuit board as the contacts are moved to the closed position.

12. The assembly of claim 9, wherein the mating interface of each of the contacts is positioned a first distance from the front when the contacts are in the closed position, and wherein the mating interface of each of the contacts is positioned a second distance from the front when the contacts are in the open position, the second distance being less than the first distance.

13. The assembly of claim 9, wherein the actuator includes a frame having a pair of parallel frame members and crosspieces that extend between the frame members, each of the crosspieces engaging a plurality of the contacts, the frame being moved by the actuation device from the unactuated position to the actuated position such that the crosspieces simultaneously push the contacts generally away from the second circuit board to the open position.

14. The assembly of claim 9, wherein the second circuit board is configured to be moved in a loading direction relative to the connector between an unloaded position and a loaded position, the loading direction being parallel to the front of the connector housing, wherein the contacts are moved out of the path of the second circuit board to allow the second circuit board to be moved in the loading direction without interference with the contacts, the contacts being moved to the closed position after the second circuit board is positioned in the loaded position.

15. An electrical system comprising:
a circuit board having contact pads; and
an electrical connector assembly comprising:
a connector having a connector housing and contacts held by the connector housing, the connector housing having a front facing the circuit board and spaced apart from the circuit board, the contacts extending out of the housing forward from the front to define a separable mating interface exterior of the housing for mating with corresponding contact pads of the circuit board, the contacts being arranged in columns;

an actuator movably coupled to the connector housing, the actuator having a frame comprising a plurality of crosspieces, each of the crosspieces engaging a corresponding one of the columns of contacts, the actuator being movable between an actuated position and an unactuated position, the contacts being deflected by the crosspieces relative to the connector housing when the actuator is moved to the actuated position, the contacts engaging the contact pads when the actuator is in the unactuated position, the contacts being held away from the contact pads by the actuator when the actuator is in the actuated position; and an actuation device configured to move the actuator between the actuated position and the unactuated position.

16. The system of claim 15, the contacts extending generally perpendicular to the front, the actuator generally slides parallel to the front between the actuated position and the unactuated position, the contacts being moved with the actuator as the actuator is moved.

17. The system of claim 15, the contacts extending outward from the front, the separable mating interface being positioned a first distance from the front when the contacts are in the closed position, and the separable mating interface being positioned a second distance from the front when the contacts are in the open position, the second distance being less than the first distance.

18. The system of claim 15, wherein the frame includes a pair of parallel frame members, the crosspieces extending perpendicular to the frame members and the crosspieces extending between the frame members, each crosspiece engaging the contacts of a corresponding one of the columns, the frame being moved by the actuation device from the unactuated position to the actuated position such that the crosspieces simultaneously push the contacts relatively closer to the connector housing.

19. The system of claim 15, wherein the circuit board is moved in a loading direction relative to the connector between an unloaded position and a loaded position, the loading direction being parallel to the front of the connector housing, wherein the contacts are moved out of the path of the circuit board to allow the mating component to be moved in the loading direction without interference with the contacts, the contacts being moved into engagement with the circuit board after the circuit board is positioned in the loaded position.

20. The system of claim 15, wherein the electrical connector assembly further comprises a plurality of contact modules holding corresponding ones of the contacts in a column, the contact modules being held within the connector housing parallel to one another.

* * * * *